United States Patent
Bourstein et al.

(10) Patent No.: US 12,345,757 B2
(45) Date of Patent: Jul. 1, 2025

(54) DECOUPLING CELLS TESTABILITY

(71) Applicant: MELLANOX TECHNOLOGIES, LTD., Yokneam (IL)

(72) Inventors: Ido Bourstein, Pardes Hanna-Karkur (IL); Idan Avni, Haifa (IL)

(73) Assignee: Mellanox Technologies, Ltd, Yokneam (IL)

( * ) Notice: Subject to any disclaimer, the term of this patent is extended or adjusted under 35 U.S.C. 154(b) by 153 days.

(21) Appl. No.: 18/309,841

(22) Filed: May 1, 2023

(65) Prior Publication Data
US 2024/0369619 A1     Nov. 7, 2024

(51) Int. Cl.
*G01R 31/28* (2006.01)

(52) U.S. Cl.
CPC ..... *G01R 31/2853* (2013.01); *G01R 31/2884* (2013.01)

(58) Field of Classification Search
CPC ............... G01R 31/2853; G01R 31/2884
USPC ..................... 324/750.3, 537, 500
See application file for complete search history.

(56) References Cited

U.S. PATENT DOCUMENTS

| | | | |
|---|---|---|---|
| 11,131,711 B1 | 9/2021 | Kurra et al. | |
| 2018/0217202 A1* | 8/2018 | Cho | G01R 31/2853 |
| 2021/0102990 A1* | 4/2021 | Lu | G01R 31/2856 |
| 2023/0307420 A1* | 9/2023 | Song | H01L 25/0657 |

OTHER PUBLICATIONS

Chen et al., "On-Chip Decoupling Capacitor Optimization for High-Performance VLSI Design", International Symposium on VLSI Technology, Systems, and Applications, pp. 99-103, May 31-Jun. 2, 1995.
Madhura et al., "Comprehensive Study of Popular VLSI Test Scan Architecture", International Journal of Engineering Research & Technology (IJERT), vol. 6, issue 11, pp. 377-385, Nov. 2017.
Gu et al., "Distributed Active Decoupling Capacitors for On-Chip Supply Noise Cancellation in Digital VLSI Circuits", 2006 Symposium on VLSI Circuits, pp. 1-2, Jun. 2006.

\* cited by examiner

*Primary Examiner* — Giovanni Astacio-Oquendo
(74) *Attorney, Agent, or Firm* — Meitar Patents Ltd.; Daniel Kligler

(57) ABSTRACT

An integrated circuit (IC) includes one or more testable voltage decoupling (DCAP) cells. Each of the testable DCAP cells includes (i) one or more decoupling capacitors connected between supply rails of the IC, and (ii) a decoupling-test active logic (DTAL) circuit, which has a normal input-output response and is configured to deviate from the normal input-output response in response to a fault in the DCAP cell.

12 Claims, 6 Drawing Sheets

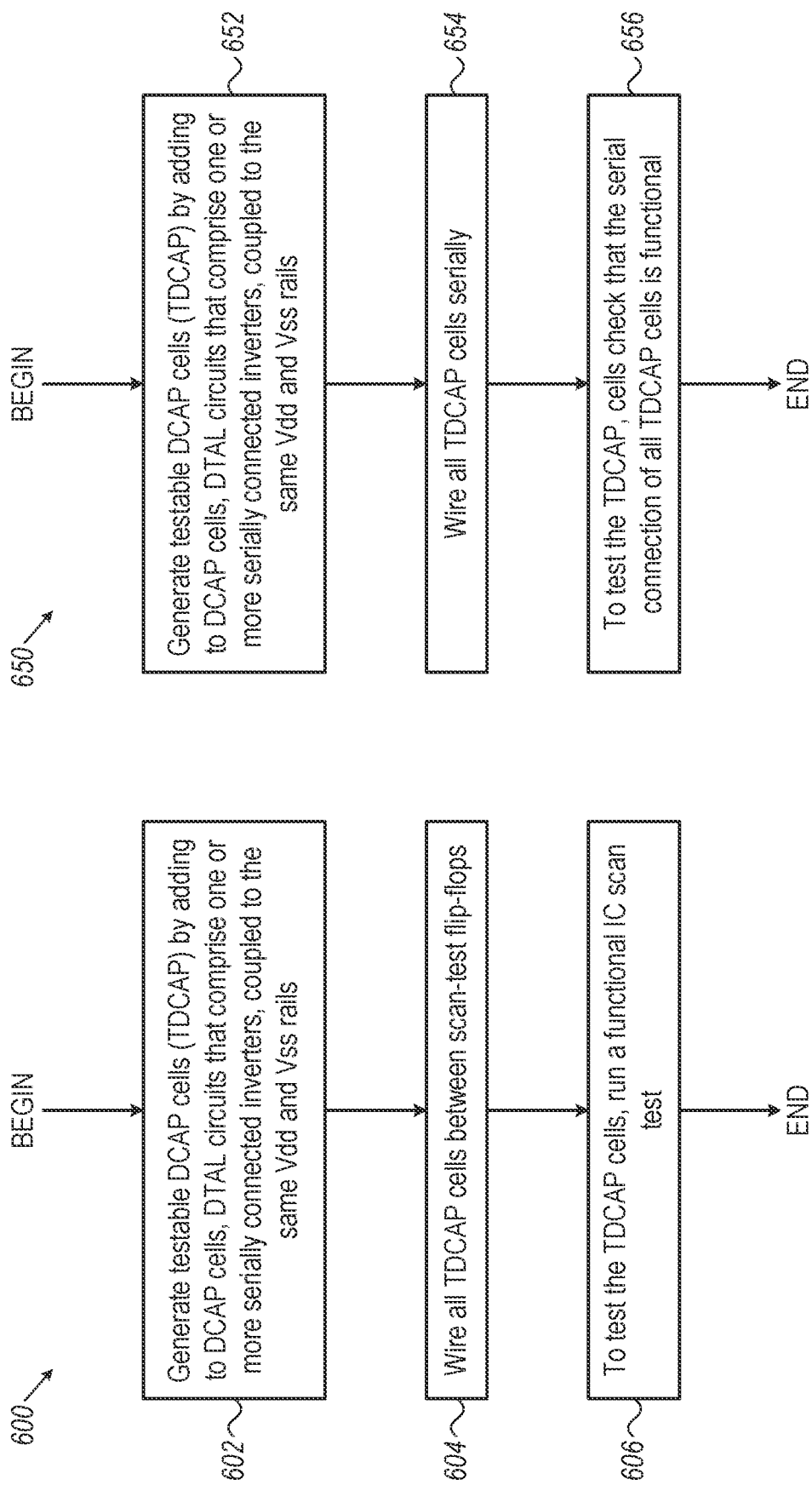

DECOUPLING CELLS TESTABILITY

FIELD OF THE INVENTION

The present invention relates generally to integrated circuits, and particularly to methods and systems for the testing of power supply decoupling cells in integrated circuits.

BACKGROUND OF THE INVENTION

Integrated circuits typically comprise a plurality of decoupling cells, to filter noise in power supplies. In "On-Chip Decoupling Capacitor Optimization for High-Performance VLSI Design", Chen et al., 1995 International Symposium on VLSI Technology, Systems, and Applications (31 May-2 Jun. 1995) (DOI: 10.1109/VTSA.1995.524641), the authors present an on-chip power bus modeling and switching noise analysis for high performance circuit design, and the methodology to optimize the placement of on-chip decoupling capacitors. The switching noise is analyzed at both the package level and the chip level. An equivalent circuit which consists of time-varying resistors, loading capacitors, and decoupling capacitors, is used to simulate the switching activities of functional blocks. Both the resistive and inductive voltage drops on the power bus are modelled to identify the hot spots on the chip and/spl delta/v across the chip. Based on the noise analysis results, a decoupling capacitor insertion algorithm is proposed to determine the amount of decoupling capacitance needed to keep the power supply voltage within specification, and optimize the final size and location of on-chip decoupling capacitors.

In "Distributed Active Decoupling Capacitors for On-Chip Supply Noise Cancellation in Digital VLSI Circuits", GU et al., 2006 symposium on VLSI circuits, June 2006 (D.O.I 10.1109/vlsic.2006.1705387), the authors propose a distributed active decoupling capacitor (decap) circuit to suppress the on-chip power supply noise in digital VLSI circuits. Effectiveness on suppressing local supply noise is verified from a 0.18 um test chip using multiple on-chip supply noise generators and supply noise sensors. Measurements show 4-11 times boost in decap value over conventional passive decaps for frequencies up to 1 GHz. Decap area reduction of 40% is achieved.

Lastly, U.S. Pat. No. 11,131,711 describes in-chip decoupling capacitor circuits (DCAPs) that are placed on a chip. These DCAPs are generally used to manage power supply noise for the chip, and can be utilized individually or as a distributed system. In some cases, DCAPs may make up a significant portion of the chip. Unfortunately, defects in DCAPs will degrade over time, will encroach into active logic, and will further cause automatic test pattern generation (ATPG) failure. There has been a lack of structural test coverage for DCAP circuits, which reduces test coverage of the chip as a whole. To this end, defects on the chip as they relate to DCAPs (i.e. shorts in the DCAP) may not be detected. The disclosure provides a structural test system and method for DCAPs and other passive logic components located on-chip.

SUMMARY OF THE INVENTION

An embodiment of the present invention that is described herein provides an integrated circuit (IC) including one or more testable voltage decoupling (DCAP) cells. Each of the testable DCAP cells includes (i) one or more decoupling capacitors connected between supply rails of the IC, and (ii) a decoupling-test active logic (DTAL) circuit, which has a normal input-output response and is configured to deviate from the normal input-output response in response to a fault in the DCAP cell.

In some embodiments, the decoupling capacitors and the DTAL circuit share one or more of the supply rails. In an embodiment, the DTAL circuit includes one or more logic gates that are laid-out in parallel to the decoupling capacitors of the DCAP cell. In an example embodiment, the DTAL circuit includes an inverter. In another embodiment, the DTAL circuit includes an active buffer.

In some embodiments, the one or more testable DCAP cells include a group of testable DCAP cells whose respective DTAL circuits are connected in series, and the IC further includes a DCAP Built-In-Self Test (BIST) circuit that is operatively coupled to the serially-connected DTAL Circuits and is configured to identify deviations from normal input-output responses occurring in the serially-connected DTAL Circuits of the testable DCAP cells.

In some embodiments, the IC further includes a scan-path including the DTAL circuit, and an Automatic Test Pattern Generation (ATPG) circuit that operatively coupled to the scan-path. In some embodiments, in addition to the one or more testable DCAP cells, the IC includes one or more non-testable DCAP cells that do not include DTAL circuits.

There is additionally provided, in accordance with an embodiment of the present invention, a method for producing an integrated circuit (IC). The method includes producing supply rails in the IC, and disposing in the IC one or more testable voltage decoupling (DCAP) cells. Each of the testable DCAP cells includes (i) one or more decoupling capacitors connected between the supply rails of the IC, and (ii) a decoupling-test active logic (DTAL) circuit, which has a normal input-output response and is configured to deviate from the normal input-output response in response to a fault in the DCAP cell.

The present invention will be more fully understood from the following detailed description of the embodiments thereof, taken together with the drawings in which:

BRIEF DESCRIPTION OF THE DRAWINGS

FIG. 6A is a flowchart that schematically illustrates a method for TDCAP testing wherein the TDACP cells are integrated in the scan path of the IC; and FIG. 6B is a flowchart that schematically illustrates a method for TDCAP testing using a dedicated TDCAP scan path, in accordance with an embodiment of the present invention.

DETAILED DESCRIPTION OF EMBODIMENTS

Overview

Figure 1:
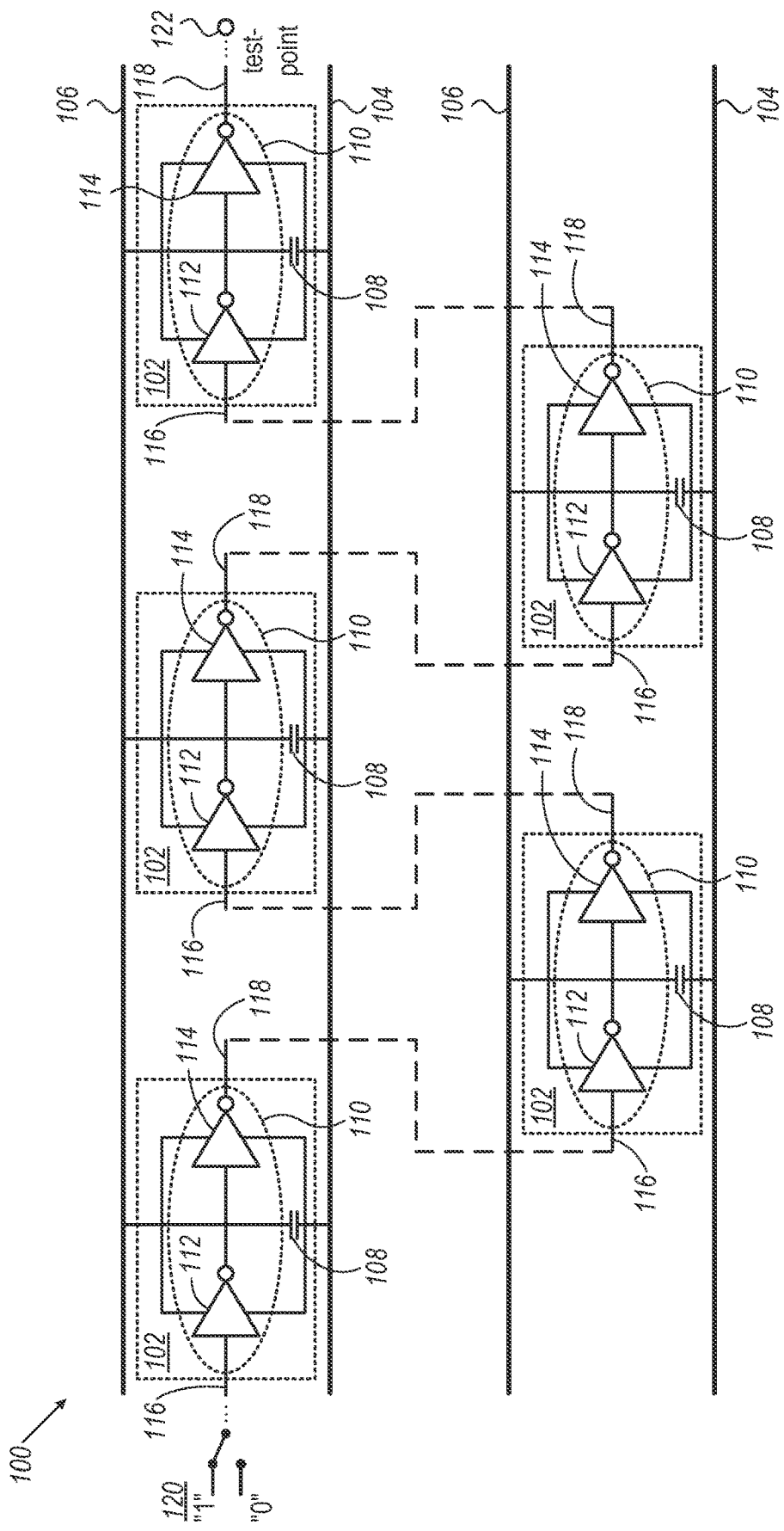
FIG. 1 is a block diagram that schematically illustrates an integrated circuit (IC) with testable voltage decoupling (TDCAP) cells, in accordance with an embodiment of the present invention.

Power supply noise in integrated circuits may stem from a variety of sources, including input noise caused by switching regulators, ground bounce, IR drop, power distribution network impedance, crosstalk and switching noise from other signals, electro-magnetic interference (EMI), inductance on power supply lines, on-chip and off-chip thermal noise, and others.

Decoupling cells, also known as decoupling capacitors, are an essential component in Integrated Circuit (IC) design, as they help to stabilize the power supply voltage and reduce high-frequency noise in the power distribution network. During the IC layout process, proper placement and sizing of decoupling cells is important for ensuring a stable power supply and preventing performance degradation. Some layout considerations for decoupling cells include proximity to power-hungry blocks, appropriate capacitance values, routing of power and ground lines. Additionally, unused layout areas are often filled with decoupling cells. This increases the total capacitance available, which can further improve the reliability of IC circuits.

Decoupling cells present a testing challenge. For example, if the ground connection of one of a plurality of decoupling cells is missing, decoupling will be slightly degraded, but, thanks to the noise tolerance of digital circuits, such degradation will not be evident except at border-line operating conditions.

Embodiments of the present invention that are described herein provide methods and circuits for testing decoupling cells. In disclosed embodiments, some or all the decoupling cells comprise an active testing circuitry logic that is tightly coupled to the decoupling capacitors, facilitating testing of the decoupling functionality. We will refer below to DCAP cells that comprise such testing circuitry as testable DCAP cells, or TDCAPs. The testing circuitry in a TDCAP will be referred to as a DCAP testing active-logic (DTAL) circuit, or simply DTAL.

A DTAL circuit in a given TDCAP comprises one or more digital components, and has a certain input-output response that is considered normal. The DTAL circuit is designed to deviate from its normal input-output response when a fault occurs in the TDCAP (the fault in question may occur in the DTAL itself or in the decoupling capacitor of the TDCAP). The fault is detected by identifying the deviation of the DTAL from the normal input-output response.

In some embodiments, the DTAL comprises an inverter; in other embodiments, comprises two or more serially-connected inverters. The inverter or inverters are coupled to power rails in proximity to the connection of the capacitors (of the respective DCAP cell) to the power rail. In embodiments, the inverters are laid out next to the decoupling capacitors of the DCAP; in an embodiment, the DACP comprises a plurality of polysilicon stripes that comprise the capacitor gate; the gates of the DTAL inverters comprise polysilicon stripes that are laid out in parallel to the capacitor's polysilicon stripes. In another embodiment, some IC layers (e.g., power metal lines, P+ wells) may be shared between the capacitors and the inverters.

In an embodiment, the TDCAP cells are embedded in the test scan path of the circuit. The functional scan path typically comprises selectable-input flip-flops that are configured to select functional inputs for functional-mode operation and the output of an upstream selectable flip-flop for scan-test mode operation. The TDCAP cells are inserted between selectable flip-flops, so that the scan test of the functional circuitry also tests the TDCAP circuits. In another embodiment, the DTAL circuits of the TDCAP cells are interconnected to form a single serially connected buffer, and a dedicated circuit tests the functionality of the serially connected buffer, thereby testing all the respective TDCAP cells.

The embodiments described hereinbelow provide a low area DCAP testing circuitry, adding a small percentage to the area of the respective DCAP cells. The testing circuitry is digital, and, hence, easily tested, using existing scan-test circuitry and/or simple additional testing circuits.

System Description

FIG. 1 is a block diagram that schematically illustrates an integrated circuit (IC) 100 with testable voltage decoupling (TDCAP) cells 102, in accordance with an embodiment of the present invention. IC 100 comprises logic and/or analog circuitry (not shown), which will be referred to hereinbelow as functional circuitry. To reduce electric noise on the supply lines of the functional circuitry, IC 100 comprises a plurality of decoupling cells which are typically distributed in the IC, in proximity to major subcircuits of the of the functional circuitry, to sensitive subcircuits, and/or in vacant areas of the IC.

According to the example embodiment illustrated in FIG. 1, the DCAP cells are testable (TDCAP), and can be tested during IC production and/or periodically. The TDCAP cells are connected to a Vss rail 104 and to a Vdd rail 106. Each TDCAP cell comprises a capacitor 108, which is configured to decouple AC noise in the power rail and a decoupling-test active logic (DTAL) circuit 110. According to the example embodiment illustrated in FIG. 1, the DTAL circuit comprises an inverter 112 and an inverter 114, wherein the input of inverter 112 is coupled to an input 116 of the TDCAP cell, the output of inverter 112 is coupled to the input of inverter 114, and the output of inverter 114 is coupled to an output 118 of the TDCAP cell.

As will be shown below (with reference to FIG. 2), each one of inverters 112, 114 comprises a PMOS transistor that is coupled to the Vdd rail, and an NMOS transistor that is coupled to the Vss rail. Except in rare cases, a failure in the Vdd or Vss connections of capacitor 108 will also affect the Vdd or Vss connections of one or both inverters 102, 104, and, hence, change the normal input-output response of DTAL 118 (e.g., a non-inverting buffer) to a response that deviates from normal input-output response.

A deviation from the normal input-output response may comprise, for example, an inverting buffer having a stuck-at-high, a stuck-at-low or a high-impedance (hi-Z) output, or a buffer with a delay that exceeds a predefined maximum. By testing the functionality of the DTAL circuits, failures of the TDCAP capacitors are expected to be detected. (We will sometimes refer herein to normal input-output response as normal functionality, and to a response that deviates from normal input-output response as abnormal functionality.)

The DTAL circuits of at least some of TDCAP circuits 102 are serially connected, from a switch 120, which is configured to output a logic 1 or a logic 0 to the input of the first DTAL. The output of the last DTAL in the serial connection is coupled to a test point 122. To test the functionality of the serially connected DTAL circuits, switch 120 outputs, for example, a logic-0 followed by a logic-1; a testing circuit (shown in subsequent figures and discussed below) then verifies that the logic-0 and the subsequent logic-1 reach a test-point 122. In an embodiment, an off-IC test equipment sets switch 120 to output logic-0 followed by logic-1 and verifies that the logic levels arrive at test-point 122. In other embodiments, an on-IC test circuit sets the switch and monitors the test-point.

It should be noted that, in embodiments, not all the DCAP cells are serially connected; for example, some cells may be tested using other methods that are not disclosed herein; in an embodiment, some of the DCAP cells may not be TDCAPs, i.e., not all DCAP cells in the IC necessarily comprise DTAL circuits.

Thus, a simple logic test can be used to test the functionality of a group of TDCAP cells.

The configuration of IC 100 illustrated in FIG. 1 and described hereinabove is cited by way of example. Other configurations may be used in alternative embodiments. For example, in some embodiments, the DTAL circuit of at least some of the DCAP circuits can be a single inverter. In other embodiments, a DTAL circuit may comprise three or more inverters. In an embodiment, the test equipment tests the total delay of the DTAL serial-connection, to detect marginal failures in which a DTAL is still connected to the power rails, but the resistance of the connections increases.

In some embodiments, for easier layout, the DTAL circuits are connected in a plurality of serial chains (and, hence, a plurality of switches 120 and test-points 122 are used).

Figure 2:
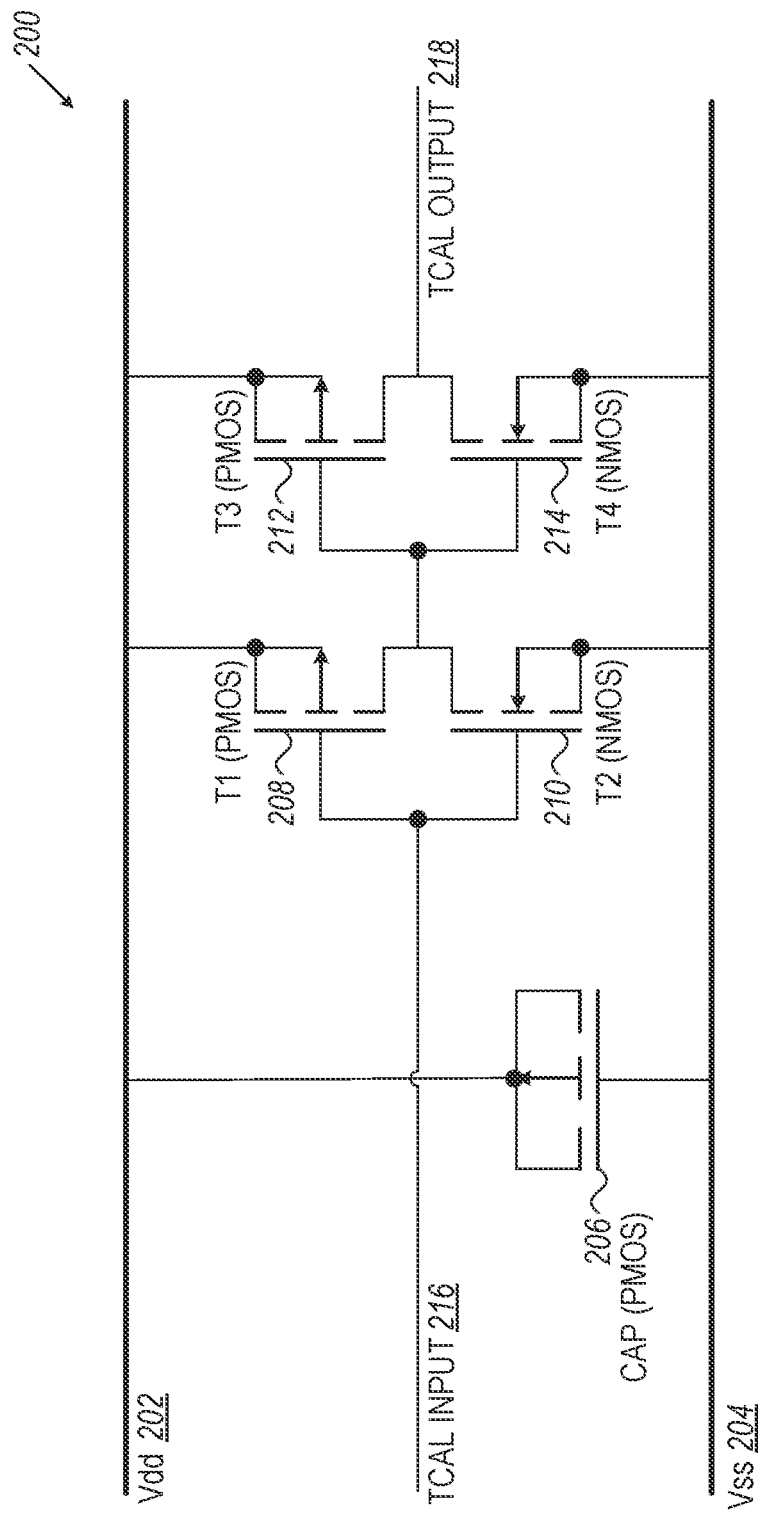
FIG. 2 is a circuit diagram that schematically illustrates a testable DCAP (TDCAP) cell, in accordance with an embodiment of the present invention.

FIG. 2 is a circuit diagram that schematically illustrates a testable DCAP (TDCAP) cell 200, in accordance with an embodiment of the present invention. The TDCAP cell is configured to reduce power supply noise between a Vdd rail 202 and a Vss rail 204, assuring better operation of functional circuitry that is in close proximity to the TDCAP cell.

The TDCAP cell comprises a P-type capacitor 206, which is, in effect, a PMOS transistor, with its gate coupled to the Vss rail, and with its source, drain and P-well coupled to the Vdd rail. In embodiments, capacitor 206 is large, for increased capacitance. The decoupling-test active logic (DTAL) of TDCAP 200 comprises a PMOS transistor 208, which is connected to an NMOS transistor 210 to form a first inverter, and a PMOS transistor 212, which is connected to an NMOS transistor 214 to form a second inverter. The input of the first inverter is coupled to a DTAL input 216 of the DCAP cell; the output of the first inverter is coupled to the input of the second inverter, and the output of the second inverter is coupled to a DTAL output 218 of the TDCAP cell. Since the Vdd and Vss of the DTAL power supply is close to the power supply of the capacitor, a failure in the power supply of the capacitor is likely to disrupt the operation of the DTAL, from normal functionality to abnormal functionality.

The configuration of TDCAP cell 200 illustrated in FIG. 2 and described hereinabove is cited by way of example. Other configurations may be used in alternative embodiments. For example, in embodiments, more capacitors may be used, including NMOS and PMOS capacitors. In some embodiments, the DTAL comprises one, two, three or any other suitable number of inverters.

Figure 3:
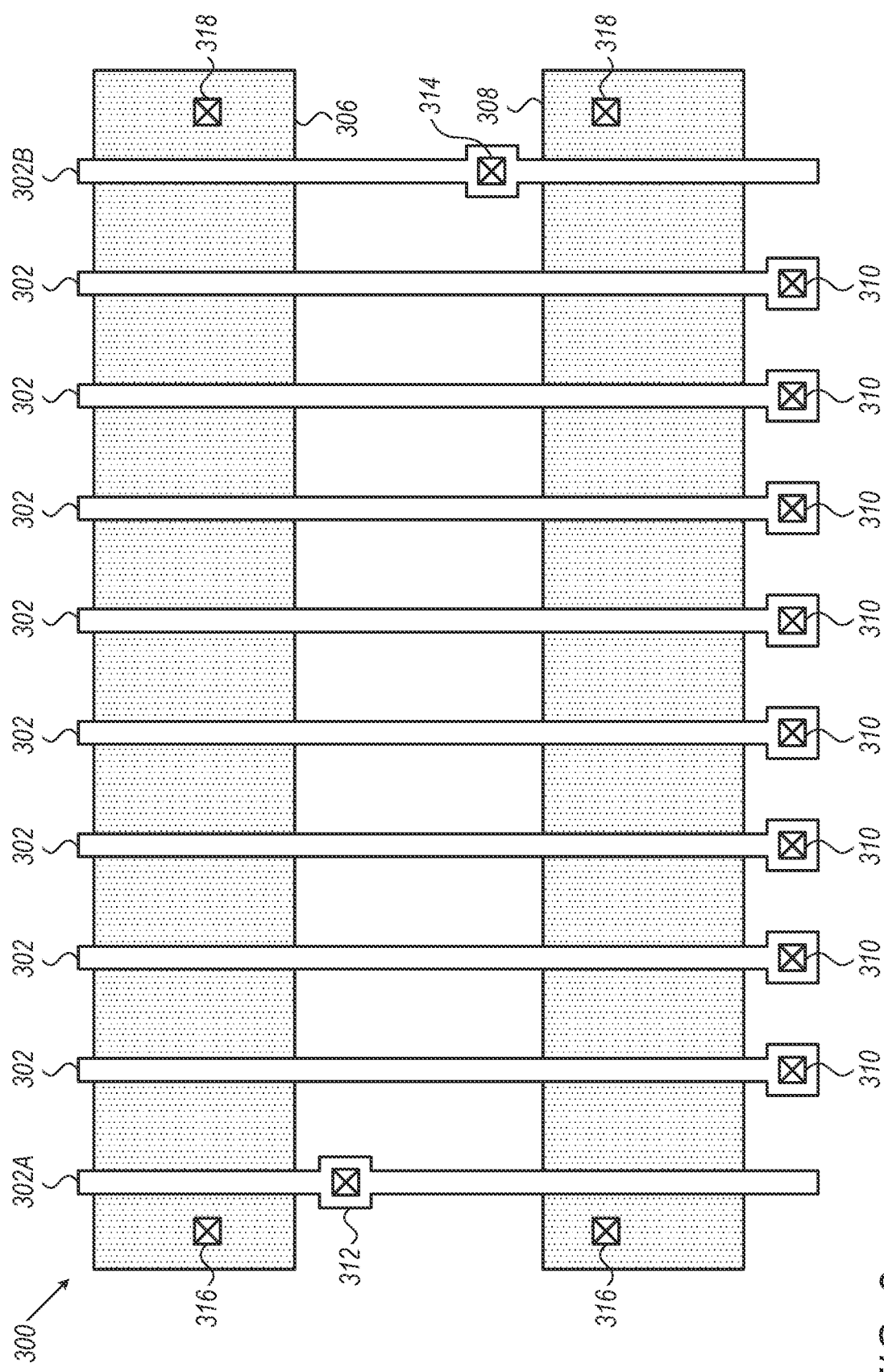
FIG. 3 is a diagram that schematically illustrates a simplified layout of a TDCAP cell, in accordance with an embodiment of the present invention.

FIG. 3 is a drawing that schematically illustrates a simplified top view of a layout 300 of a TDCAP cell, in accordance with an embodiment of the present invention. It should be noted that layout 300 is partial, in the sense that it shows a small subset of the layout masks; simplified, in the sense that it does not show details of the masks contours, and not in scale. Layout 300 is depicted for the sole purpose of showing how the DTAL inverters added to the decoupling capacitors are easily integrated, with no major change to the DCAP layout.

The layout comprises vertical polysilicon stripes 302, 302A and 302B, a P+ diffusion 306 (to form P-type transistors), an N+ diffusion 308 (to form N-type transistors), poly to metal contacts 310, 312, 314 and diffusion to metal contacts 318, 316.

Except for the left-most and the right-most portions (where contacts 316 and 318 are located) P+ diffusion 306 is connected to Vdd. When the polysilicon stripes 302 are laid over the P+ diffusion, thin oxide is built below the polysilicon stripe, and P-type capacitors, between Vdd and Vss are formed. N+ diffusion 308 is connected to Vss, except for the left-most and the right-most portions (where contacts 316 and 318 are located).

The leftmost polysilicon 302A is the input of the first inverter (e.g., inverter 112 of FIG. 1) of the DTAL cell; a P-type transistor is built when polysilicon 302A is laid over P+ diffusion 306 (transistor 208, FIG. 2) and, similarly, an N-type transistor (transistor 210, FIG. 2) is built over N+ diffusion 308. contacts 316 are the output of the inverter. They are connected (by a metal stripe that is not shown) through contact 314 to the rightmost polysilicon 302B, which is the input of the second DTAL inverter (e.g., inverter 114 of FIG. 1). The inverter comprises a P-type transistor (transistor 212, FIG. 2), which is built when polysilicon 302B is laid out over P+ diffusion 306, and an N-type transistor (transistor 214, FIG. 2), which is built when polysilicon 302B is laid out over N+ diffusion 308. The output of the second inverter comprises the pair of contacts 318.

Testable DCAP cell layout 300, illustrated in FIG. 3 and described hereinabove, is a simplified layout that is cited by way of example. Other layouts may be used in alternative embodiments, with a different number and a different structure of decoupling transistors and inverters. In some embodiments, for example, the decoupling capacitors comprise N-type in capacitors; other embodiments, both P-type and N-type capacitors are used.

Using Scan Path to Test the TDCAP Cells

In some embodiments, a scan path such as JTAG is used to test the TDCAP cells. For background on scan-path testing of VLSI devices, the reader is referred to "Comprehensive Study of Popular VLSI Test Scan Architecture", Madhura et. al., International Journal of Engineering Research Technology (IJERT) Vol. 6 Issue 11, November-2017.

Figure 4:
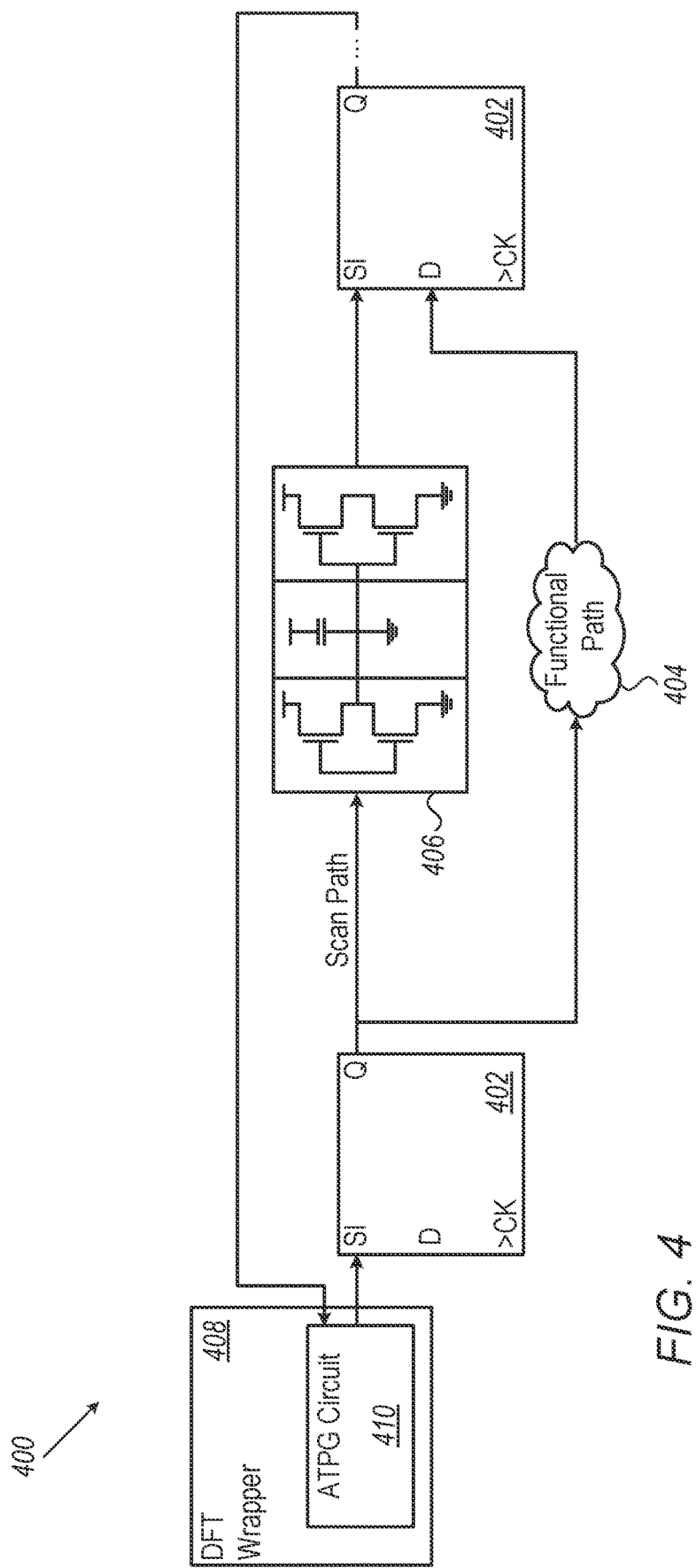
FIG. 4 is a block diagram that schematically illustrates a scan test circuit with integrated TDCAP cells in an IC, in accordance with an embodiment of the present invention.

FIG. 4 is a block diagram that schematically illustrates a scan test circuit 400 with integrated TDCAP cells in an IC, in accordance with an embodiment of the present invention. The IC comprises scannable flip-flops 402, which are configured to be in a functional mode or in a test mode. When in functional mode, the scannable flipflops propagate functional paths 404; when in test mode, the selectable flipflop are interconnected, to form a scan shift register. According to the example embodiment illustrated in FIG. 4, TDCAP cells are connected in the scan path between the selectable flip-flops.

A Design-for-Testability (DFT) wrapper 408 comprises multiple DFT circuits of the IC, including an Automatic Test Pattern Generator (ATPG) circuit 410. When the IC is in a scan-test mode, The ATPG circuit is configured to: i) set all the selectable flip-flops to a scan mode, to form a scan shift register; ii) send a series of logic-1 and logic-0 to the first flip-flop of the shift register; and, iii) check that the sent pattern propagates through the scan path by examining the output of the shift register.

According to the example embodiment illustrated in FIG. 4, the scan path includes one or more TDCAP cells 402. If any of the TDCAP cells are faulty, the shift register operation will be disrupted, and the ATPG circuit will detect a failure.

It should be noted that the DTAL cells must adhere to the timing requirements of the scan test; if the propagation time through the DTAL cells is slower than the propagation time through other functional circuits of the IC, the functional scan test will be slower.

In some embodiments, adding of the TDCAP cells to the scan path brings about an additional benefit—the TDCAP cells increase the delay of the scan data path, (which comprises very small routing delays when TDCAP cells are not added), easing hold-time closure. Moreover, the use of TDCAP cells in the scan path may obviate the need for dedicated hold buffers and thus reduce the chip area.

Figure 5:
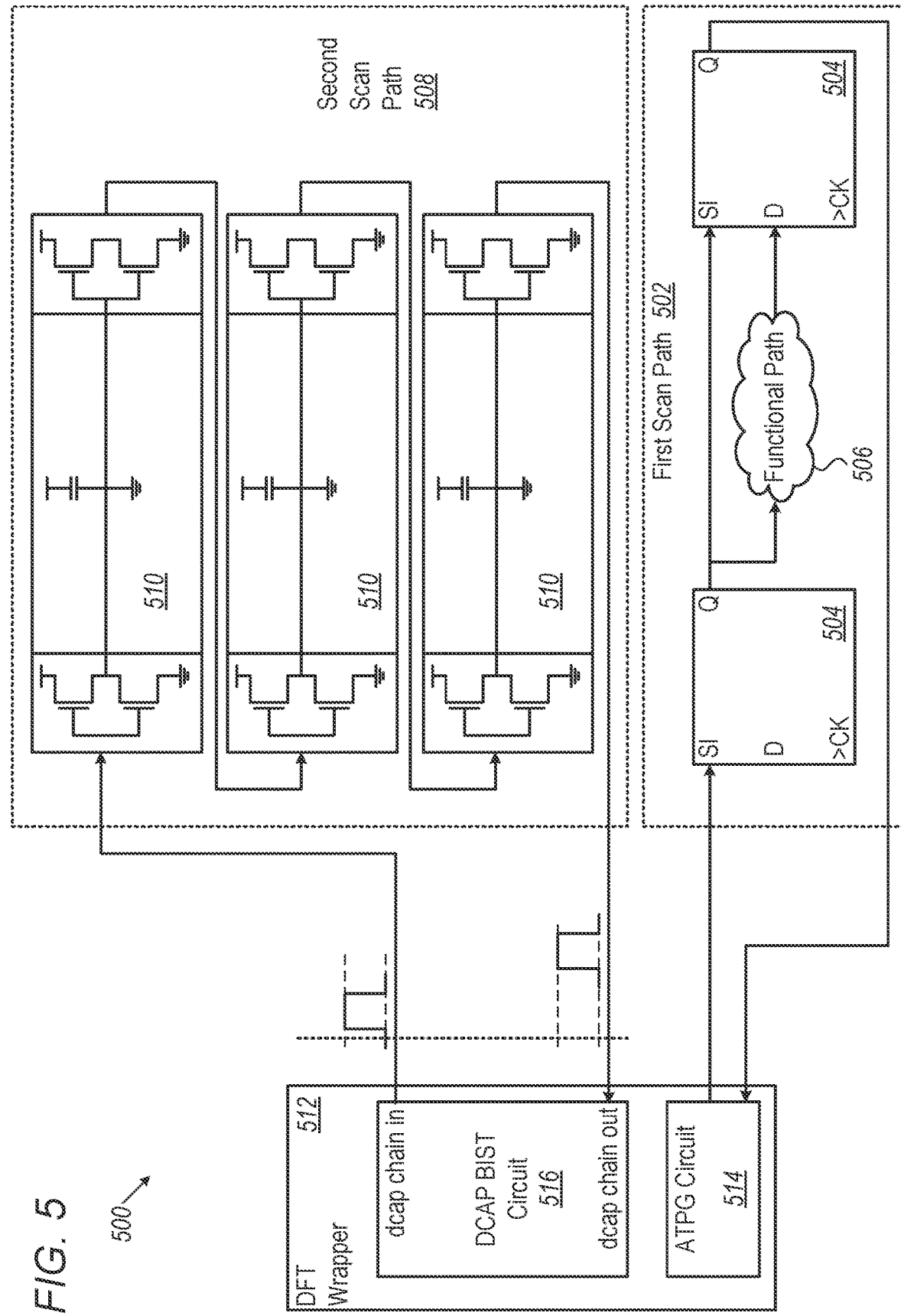
FIG. 5 is a block diagram that schematically illustrates a scan test circuit with a separate path for TDCAP cells in an IC, in accordance with an embodiment of the present invention.

FIG. 5 is a block diagram that schematically illustrates a scan test circuit 500 with a separate path for TDCAP cells in an IC, in accordance with an embodiment of the present invention. The scan test circuit includes a first scan path 502 for the non-voltage-decoupling part of the IC, comprising scannable flip-flops 504 and functional circuitry 506, and a second scan path 508 for TDCAP cells 510, including a plurality of TDCAP cells, connected to each other, to form a TDCAP testing shift register.

A DFT Wrapper 512 comprises multiple DFT circuits of the IC, including an ATPG circuit 514, which is configured to scan-test the functional circuitry of the IC, and a DCAP Built-In Self-Test (BIST) circuit 516. The BIST circuit is configured to send a pulse to the input of the first TDCAP cell of the TDCAP testing shift register and to test that a that the last TDCAP cell outputs the pulse, after a delay; in embodiments the TDCAP BIST circuit is configured to indicate that the TDCAP test fails if the delay exceeds a preset maximum value, or a stuck at 0/stuck at 1 value is detected.

Scan test circuit 500 comprises a dedicated chain that is not part of the IC functional path, thus enables testing of the TDCAP chain during functional mode and not only during test mode.

The configurations of scan test circuit with integrated TDCAP cells 400 and scan test circuit with a separate path for TDCAP cells 500 illustrated in FIGS. 4, 5 and described above are examples that are cited merely for the sake of conceptual clarity. Other configurations may be used in alternative configurations. For example, in an embodiment, the TDCAP cells are connected in more than one scan test, for faster parallel testing.

FIG. 6A is a flowchart that schematically illustrates a method 600 for TDCAP testing wherein the TDACP cells are integrated in the scan path of the IC. The method is executed by the IC designer (using suitable software tools) and, partly, by a test circuit.

The flowchart starts with a Generate TDCAP cells operation 602, wherein the designer adds DTAL circuitry to DCAP cells, to form TDCAP cells. The DTAL circuits, in embodiments, comprise one or more inverters that are coupled to the Vdd and Vss rails to which the decoupling capacitors of the DCAP cells are coupled; failures in the power connections of the DCAP cells usually cause an abnormal functionality of the respective DTAL circuit. In embodiments, the designer replaces the DCAP cells with TDCAP cells that comprise DTAL circuits; in an embodiment, all DCAP cells are TDCAP cells that comprise DTAL circuits, and operation 602 is cancelled.

Next, at Wire-TDCAP-Cells-Between-Scan-Test-Flip-Flops operation 604, the designer wires each TDCAP between a pair of scan flipflops, thus, adding the decoupling cells to the scan path (alternatively or additionally, the designer can wire a plurality of serially-connected TDCAP cells between scannable flipflops).

To test the TDCAP, a test circuit, at a Test TDCAP operation 606, runs the scan test of the IC; as the TDCAP cells are now part of the scan path, a failure in any TDCAP will result in a test failure.

FIG. 6B is a flowchart that schematically illustrates a method 650 for TDCAP testing using a dedicated TDCAP scan path, in accordance with an embodiment of the present invention. The method is executed by the IC designer (using suitable software tools) and, partly, by a test circuit.

The method starts with a Generate TDCAP ells operation 652, which is identical to operation 602 of flowchart 600. Next, at a Wire TDCAP cell serially, the designer connects the DTAL circuits of the TDCAP cells, from outputs to inputs, to form a single interconnected chain of inverters. Lastly, at a Test-TDCAP operation 656, a test circuit may test that the chain of inverters is functional; e.g., if there are two inverters in each DTAL circuit, check that the chain transfers a pulse in the input to the output, after a delay that is shorter than a preset limit.

It should be noted that the method of flowchart 650, since the dedicated chain is not part of the IC functional path, enables testing of the TDCAP chain not only during test mode but also during functional mode.

Flowcharts 600 and 650, illustrated in FIGS. 6A, 6B and described hereinabove, are cited by way of example; other flowcharts may be used in alternative embodiments. For example, in an embodiment, multiple test chains may be formed, including chains in which the TDCAP are integrated in functional test scans, and in dedicated TDCAP chains.

The configurations of IC 100, TDCAP buffer 200, integrated TDCAP-cells scan test 400, separate TDCAP-cells testing path 500, TDCAP layout 300 and the methods of flowcharts 600, 650, illustrated in FIGS. 1 through 6B and described hereinabove, are example configurations, flowcharts and layout that are shown purely for the sake of conceptual clarity. Any other suitable configurations, flowcharts and layouts can be used in alternative embodiments. The different sub-units of IC 100 may be implemented using suitable hardware, such as in one or more Application-Specific Integrated Circuits (ASICs) or Field-Programmable Gate Arrays (FPGAs), using software, using hardware, or using a combination of hardware and software elements.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An integrated circuit (IC), comprising one or more testable voltage decoupling (DCAP) cells, each of the testable DCAP cells comprising:
   one or more decoupling capacitors connected between supply rails of the IC; and a decoupling-test active logic (DTAL) circuit, wherein the DTAL circuit comprises an inverter or an active buffer; wherein the inverter or the active buffer, which has a normal input-output response, is configured to deviate from the normal input-output response in response to a fault in the DCAP cell.

2. The IC according to claim 1, wherein the one or more decoupling capacitors and the DTAL circuit share one or more of the supply rails.

3. The IC according to claim 1, wherein the DTAL circuit comprises one or more logic gates that are laid-out in parallel to the one or more decoupling capacitors of the DCAP cell.

4. The IC according to claim 1, wherein the one or more testable DCAP cells comprise a group of testable DCAP cells whose respective DTAL circuits are connected in series, and wherein the IC further comprises a DCAP Built-In-Self Test (BIST) circuit that is operatively coupled to the serially-connected DTAL Circuits and is configured to identify deviations from normal input-output responses occurring in the serially-connected DTAL Circuits of the testable DCAP cells.

5. The IC according to claim 1, further comprising a scan-path comprising the DTAL circuit, and an Automatic Test Pattern Generation (ATPG) circuit that is operatively coupled to the scan-path.

6. The IC according to claim 1, wherein, in addition to the one or more testable DCAP cells, the IC comprises one or more non-testable DCAP cells that do not comprise DTAL circuits.

7. A method for producing an integrated circuit (IC), the method comprising:
    producing supply rails in the IC; and
    disposing in the IC one or more testable voltage decoupling (DCAP) cells, each of the testable DCAP cells comprising:
        one or more decoupling capacitors connected between the supply rails of the IC; and
        a decoupling-test active logic (DTAL) circuit, wherein the DTAL circuit comprises an inverter or an active buffer; wherein the inverter or the active buffer, which has a normal input-output response, is configured to deviate from the normal input-output response in response to a fault in the DCAP cell.

8. The method according to claim 7, wherein the one or more decoupling capacitors and the DTAL circuit share one or more of the supply rails.

9. The method according to claim 7, wherein the DTAL circuit comprises one or more logic gates that are laid-out in parallel to the one or more decoupling capacitors of the DCAP cell.

10. The method according to claim 7, wherein disposing the one or more testable DCAP cells comprise disposing a group of testable DCAP cells whose respective DTAL circuits are connected in series, and comprising disposing in the IC a DCAP Built-In-Self Test (BIST) circuit that is operatively coupled to the serially-connected DTAL Circuits and is configured to identify deviations from normal input-output responses occurring in the serially-connected DTAL Circuits of the testable DCAP cells.

11. The method according to claim 9, further comprising disposing a scan-path comprising the DTAL circuit, and an Automatic Test Pattern Generation (ATPG) circuit that is operatively coupled to the scan-path.

12. The method according to claim 9, further comprising disposing, in addition to the one or more testable DCAP cells, one or more non-testable DCAP cells that do not comprise DTAL circuits.

* * * * *